United States Patent [19]

Ling

[11] Patent Number: 5,329,547
[45] Date of Patent: Jul. 12, 1994

[54] METHOD AND APPARATUS FOR COHERENT COMMUNICATION IN A SPREAD-SPECTRUM COMMUNICATION SYSTEM

[75] Inventor: Fuyun Ling, Hoffman Estates, Ill.

[73] Assignee: Motorola, Inc., Schaumburg, Ill.

[21] Appl. No.: 31,258

[22] Filed: Mar. 11, 1993

[51] Int. Cl.$^5$ ............................................ H04K 1/00
[52] U.S. Cl. ....................................................... 375/1
[58] Field of Search ............................................ 375/1

[56] References Cited

U.S. PATENT DOCUMENTS

| | | |
|---|---|---|
| 5,09,204 | 3/1992 | Wheatley, III . |
| 4,559,633 | 12/1985 | Kan et al. ........................ 375/1 |
| 4,730,340 | 3/1988 | Frazier ........................... 375/1 |
| 4,811,357 | 3/1989 | Betts et al. . |
| 4,901,307 | 2/1990 | Gilhousen et al. . |
| 5,029,184 | 7/1991 | Andren et al. ................... 375/1 |
| 5,056,109 | 10/1991 | Gilhousen et al. . |
| 5,101,501 | 3/1992 | Gilhousen et al. . |
| 5,103,459 | 4/1992 | Gilhousen et al. . |
| 5,107,225 | 4/1992 | Wheatley, III . |
| 5,109,390 | 4/1992 | Gilhousen et al. . |
| 5,181,225 | 1/1993 | Neeser et al. ................... 375/1 |
| 5,214,669 | 5/1993 | Zarembowitch ................ 375/1 |

OTHER PUBLICATIONS

Sklar, Bernard, *Digital Communications: Fundamentals and Applications*, Prentice Hall, Englewood Cliffs, N.J., 1988, Chapters 5 & 6 pp. 245-380 (1988).

Dixon, Robert C., *Spread Spectrum Systems 2nd Ed.*, John Wiley & Sons, New York, N.Y., 1984 Chapters 1 & 2, pp. 1-55 (1984).

"On the System Design Aspects of Code Division Multiple Access (CDMA) Applied to Digital Cellular and Personal Communications Networks", A. Salmasi and K. S. Gilhousen, *Proc. of 41st Vehicular Technology Conference* in St. Louis, Mo., May 19-22, 1991, pp. 57-62.

"The Weight Spectra of Some Short Low-Rate Convolutional Codes", Jean Conan, *IEEE Transactions on Communications*, vol. COM-32, No. 9 (Sep. 1984), pp. 1050-1053.

"Performance of Convolutional Codes with Interleaving in the Interference Limited Rayleigh Fading Channel", Li Fung Chang and Sirikiat Ariyavisitakul, *Proceedings of 41st Vehicular Technology Conference* in St. Louis, Missouri, May 19-22, 1991, pp. 812-816.

K. S. Gilhousen, et al., "On the Capacity of a Cellular CDMA Sysetm," *IEEE Trans. on VT*, vol. 40, No. 2, pp. 303-311, May 1991.

F. Ling and D. Falconer, "Orthogonal/Convolutional Coding for Reverse Channel CDMA Communication," *Proc. of VTC'92*, pp. 63-66, May, 1992, Denver, Colo.

L. F. Chang and N. R. Sollenberger, "Comparison of Two Interleaving Techniques for CDMA Radio Communication Systems," *Proc. of VTC'92*, pp. 275-278, May, 1992, Denver, Colo.

(List continued on next page.)

*Primary Examiner*—David C. Cain
*Attorney, Agent, or Firm*—Richard A. Sonnentag; Shawn B. Dempster

[57] ABSTRACT

A method and apparatus is provided for encoding and decoding to facilitate coherent communication. In encoding, reference symbols are inserted into a stream of input data symbols to form a reference coded stream of input data symbols. Subsequently, the reference coded stream of input data symbols are prepared for transmission over a communication channel by spreading the reference coded stream of input data symbols with a spreading code prior to transmission over the communication channel. In decoding, a received communication signal is despread with a spreading code to derive a stream of reference samples and a stream of data samples. The channel response is estimated by utilizing the stream of reference samples. Finally, an estimated data symbol is detected from the stream of data samples by utilizing the estimated channel response.

42 Claims, 2 Drawing Sheets

OTHER PUBLICATIONS

Y. J. Liu, "Soft Decision Decoding for a Bit-Interleaved Convolutionally Encoded Code Division Multiple Access Sysetm over Rayleigh Fading Channel," *Proc. of PIMRC'92*, pp. 128–132, Oct. 1992.

M. L. Moher and J. H. Lodge, "TCMP-A Modulation and Coding Stategy for Fading Channels," *IEEE JSAC*, vol. SAC-7, pp. 1347–1355, Dec. 1985.

G. T. Irvine and P. J. McLane, "Symbol-Aided Plus Decision-Directed Reception for PSK/TCM Modulation on Shadowed Mobile Satellite Fading Channels," *IEEE JSAC*, vol. SAC-10, pp. 1289–1299, Dec. 1992.

A. J. Viterbi, "Spread Spectrum Communications—Myths and Realities," *IEEE Comm. Magazine*, vol. 17, No. 3, pp. 11–18, May 1979.

A. J. Viterbi and A. M. Viterbi, "Nonlinear Estimation of PSK-Modulated Carrier Phase with Application to Burst Digital Transmition," *IEEE Trans. on Info. Theory*, vol. IT-29, No. 4, pp. 543–551, Jul. 1983.

METHOD AND APPARATUS FOR COHERENT COMMUNICATION IN A SPREAD-SPECTRUM COMMUNICATION SYSTEM

FIELD OF THE INVENTION

The present invention relates to communication systems which employ spread-spectrum signals and, more particularly, to a method and apparatus for coherent communication in a spread-spectrum communication system.

BACKGROUND OF THE INVENTION

Communication systems take many forms. In general, the purpose of a communication system is to transmit information-bearing signals from a source, located at one point, to a user destination, located at another point some distance away. A communication system generally consists of three basic components: transmitter, channel, and receiver. The transmitter has the function of processing the message signal into a form suitable for transmission over the channel. This processing of the message signal is referred to as modulation. The function of the channel is to provide a physical connection between the transmitter output and the receiver input. The function of the receiver is to process the received signal so as to produce an estimate of the original message signal. This processing of the received signal is referred to as demodulation.

One type of communication system is a multiple access spread-spectrum system. In a spread-spectrum system, a modulation technique is utilized in which a transmitted signal is spread over a wide frequency band within the communication channel. The frequency band is much wider than the minimum bandwidth required to transmit the information being sent. A voice signal, for example, can be sent with amplitude modulation (AM) in a bandwidth only twice that of the information itself. Other forms of modulation, such as low deviation frequency modulation (FM) or single sideband AM, also permit information to be transmitted in a bandwidth comparable to the bandwidth of the information itself. However, in a spread-spectrum system, the modulation of a signal to be transmitted often includes taking a baseband signal (e.g., a voice channel) with a bandwidth of only a few kilohertz, and distributing the signal to be transmitted over a frequency band that may be many megahertz wide. This is accomplished by modulating the signal to be transmitted with the information to be sent and with a wideband encoding signal.

Three general types of spread-spectrum communication techniques exist, including direct sequence modulation, frequency and/or time hopping modulation, and chirp modulation. In direct sequence modulation, a carrier signal is modulated by a digital code sequence whose bit rate is much higher than the information signal bandwidth.

Information (i.e. the message signal consisting of voice and/or data) can be embedded in the direct sequence spread-spectrum signal by several methods. One method is to add the information to the spreading code before it is used for spreading modulation. It will be noted that the information being sent must be in a digital form prior to adding it to the spreading code, because the combination of the spreading code and the information typically a binary code involves modulo-2 addition. Alternatively, the information or message signal may be used to modulate a carrier before spreading it.

These direct sequence spread-spectrum communication systems can readily be designed as multiple access communication systems. For example, a spread-spectrum system may be designed as a direct sequence code division multiple access (DS-CDMA) system. In a DS-CDMA system, communication between two communication units is accomplished by spreading each transmitted signal over the frequency band of the communication channel with a unique user spreading code. As a result, transmitted signals are in the same frequency band of the communication channel and are separated only by unique user spreading codes. These unique user spreading codes preferably are orthogonal to one another such that the cross-correlation between the spreading codes is approximately zero.

Particular transmitted signals can be retrieved from the communication channel by despreading a signal representative of the sum of signals in the communication channel with a user spreading code related to the particular transmitted signal which is to be retrieved from the communication channel. Further, when the user spreading codes are orthogonal to one another, the received signal can be correlated with a particular user spreading code such that only the desired user signal related to the particular spreading code is enhanced while the other signals for all of the other users are not enhanced.

It will be appreciated by those skilled in the art that several different spreading codes exist which can be used to separate data signals from one another in a DS-CDMA communication system. These spreading codes include but are not limited to pseudonoise (PN) codes and Walsh codes. A Walsh code corresponds to a single row or column of the Hadamard matrix.

Further it will be appreciated by those skilled in the art that spreading codes can be used to channel code data signals. The data signals are channel coded to improve performance of the communication system by enabling transmitted signals to better withstand the effects of various channel impairments, such as noise, fading, and jamming. Typically, channel coding reduces the probability of bit error, and/or reduces the required signal to noise ratio usually expressed as error bits per noise density (i.e., $E_b/N_o$ which is defined as the ratio of energy per information-bit to noise-spectral density), to recover the signal at the cost of expending more bandwidth than would otherwise be necessary to transmit the data signal. For example, Walsh codes can be used to channel code a data signal prior to modulation of the data signal for subsequent transmission. Similarly PN spreading codes can be used to channel code a data signal.

However, channel coding alone may not provide the required signal to noise ratio for some communication system designs which require the system to be able to handle a particular number of simultaneous communications (all having a minimum signal to noise ratio). This design constraint may be satisfied, in some instances, by designing the communication system to coherently detect transmitted signals rather than using non-coherent reception techniques. It will be appreciated by those skilled in the art that a coherent receiver requires less signal to noise ratio (in $E_b/N_o$) than that required by a non-coherent receiver having the same bit error rate (i.e., a particular design constraint denoting an acceptable interference level). Roughly speaking, there is a three deciBel (dB) difference between them for the Rayleigh fading channel. The advantage of the coherent receiver is more significant when diversity reception is used, because there is no combining loss for an optimal coherent receiver while there is always a combining loss for noncoherent receiver.

One such method for facilitating coherent detection of transmitted signals is to use a pilot signal. For example, in a cellular communication system the forward channel, or down-link, (i.e., from base station to mobile unit) may be coherently detected, if the base station transmits a pilot signal. Subsequently, all the mobile units use the pilot channel signal to estimate the channel phase and magnitude parameters. However, for the reverse channel, or up-link, (i.e., from mobile to base station), using such a common pilot signal is not feasible. As a result, those of ordinary skill in the art often assume that only non-coherent detection techniques are suitable for up-link communication.

As a result, many recent publications have focused on optimizing non-coherent reception in DS-CDMA systems. For example see the following articles.

A. Salmasi and K. S. Gilhousen, "On The System Design Aspects of Code Division Multiple Access (CDMA) Applied to Digital Cellular And Personal Communications Networks," *Proc. of VTC'91*, pp. 57-62, 1991.

F. Ling and D. Falconer, "Orthogonal/Convolutional Coding for Reverse Channel CDMA Communication," *Proc. of VTC'92*, pp. 63-66, May, 1992, Denver, Colo.

L. F. Chang and N. R. Sollenberger, "Comparison of Two Interleaving Techniques for CDMA Radio Communication Systems," *Proc. of VTC'92*, pp. 275-278, May, 1992, Denver, Colo.

Y. J. Liu, "Soft Decision Decoding for a Bit-Interleaved Convolutionally Encoded Code Division Multiple Access System over Rayleigh Fading Channel," *Proc. of PIMRC'92*, pp. 128-132, October 1992.

Each of these articles show that a substantial difference in performance exists when different coding, modulation, detection and interleaving techniques are used for up-link communication in cellular communication systems.

In the A. Salmasi and K. S. Gilhousen article, a DS-CDMA communication system is described which uses bit-by-bit interleaving within convolutional and orthogonal coding scheme to optimize non-coherent reception in DS-CDMA communication systems.

In the F. Ling and D. Falconer article as well as the L. F. Chang and N. R. Sollenberger article, an up-link DS-CDMA system that employs Walsh coding (i.e., orthogonal coding), non-coherent detection and using orthogonal symbol (i.e., word-by-word) interleaving instead of bit-by-bit interleaving was disclosed. The L. F. Chang and N. R. Sollenberger article shows that a word-by-word interleaved convolutional and orthogonal coding scheme requires about 1 to 1.4 dB less $E_b/N_o$ than the similar bit-by-bit interleaving scheme described by in the A. Salmasi and K. S. Gilhousen article when the communication system which employs either scheme also utilizes power control of mobile communication units which move at different speeds (e.g., move at rates ranging from 0 to 100 kilometers per hour). While the word-by-word interleaving convolutional/orthogonal coding scheme has better performance than the bit-by-bit one, it has less implicit diversity than the latter. Moreover, it is still a non-coherent communication system and the combing loss can not be avoided.

Finally, the Y. J. Liu article describes a more sophisticated detection technique in which the performance of the up-link DS-CDMA communication system with Walsh coding and bit-level interleaving can be improved with a 4-port diversity combining without changing the interleaving method.

However, even in view of the above-described improvements for non-coherent communication systems, a need still exists for a communication system which employs coherent detection techniques.

SUMMARY OF THE INVENTION

A method and apparatus is provided for encoding and decoding to facilitate coherent communication. In encoding, reference symbols are inserted into a stream of input data symbols to form a reference coded stream of input data symbols. Subsequently, the reference coded stream of input data symbols are prepared for transmission over a communication channel by spreading the reference coded stream of input data symbols with a spreading code prior to transmission over the communication channel. In decoding, a received communication signal is despread with a spreading code to derive a stream of reference samples and a stream of data samples. The channel response is estimated by utilizing the stream of reference samples. Finally, an estimated data symbol is detected from the stream of data samples by utilizing the estimated channel response.

DETAILED DESCRIPTION

In the course of the following discussion, a new approach for up-link DS-CDMA communication is presented. This new approach employs coherent-detection with reference-symbol based channel estimation. It will be appreciated by those skilled in the art that other types of communication systems (e.g., personal communication systems, trunked systems, satellite communication systems, data networks, and the like) may also be adapted and/or designed to use the principles described herein. It will be shown that a substantial gain in $E_b/N_0$ can be obtained relative to non-coherent detection techniques by applying such a coherent detection method to up-link DS-CDMA communication. In particular, simulation results have shown that the required $E_b/N_0$ by using this new scheme is about 2.5 dB lower than non-coherent detection of Walsh coding with bit-by-bit interleaving or 1.3 dB lower than non-coherent detection with Walsh symbol (i.e., word-by-word) interleaving over the entire range of practical mobile communication unit speeds (i.e., speeds of 0 to 100 kilometers per hour). The analysis of this new scheme is given in the frequency-domain. This frequency-domain analysis results in a simple formula that characterizes the performance loss of such a scheme relative to perfect coherent detection.

In order to perform effective coherent detection, it is necessary to obtain an accurate channel estimate. There are basically two types of channel estimation methods: data-based and reference-based. Data-based channel estimation may be implemented as decision-directed or non-decision-directed. For DS-CDMA up-link communication, the channel estimator must operate at low signal-to-noise ratios and the fading is relatively fast. As a result, the decision-directed approach is not appropriate due to the high decision error rate. On the other hand, a non-decision-directed method, such as the one described in the article by A. J. Viterbi and A. M. Viterbi, "Nonlinear Estimation of PSK-Modulated Carrier Phase with Application to Burst Digital Transmission," *IEEE Trans. on Info. Theory*, Vol. IT-29, No. 4, pp. 543-551, July 1983, always has a phase ambiguity, e.g., 180° ambiguity for binary phase shift keying (BPSK) or 90° ambiguity for quadrature phase shift keying (QPSK), in the channel estimate. As a consequence, it is necessary to use differential coding to eliminate its effect. However, as will be appreciated by those skilled in the art, in communication systems having a differential coded signal transmitted over Rayleigh fading channels, even with coherent detection, still need over 3 dB higher $E_b/N_0$ than non-differentially coded phase shift keying (PSK) signaling.

One way to solve the decision error and phase ambiguity problem is to use reference symbols for channel estimation. Reference-symbol-based channel estimation is described as follows. Reference symbols known to the receiver are inserted into a sequence of information bearing data symbols, which may be coded symbols. At the receiver, the received signal samples corresponding to the reference symbols are used to generate a channel estimate. Because the reference symbols are known to the receiver, there are no decision errors and the resulting channel estimate does not have a phase ambiguity. As a result, a robust communication system with non-differentially coded signaling is provided.

The inserted reference symbols can be organized in blocks or uniformly distributed. For a flat fading channel, it is desirable to insert reference symbols periodically and uniformly in the data stream. For a DS-CDMA up-link with a RAKE receiver for front end processing, we can treat the output of each RAKE "finger" as being a flat faded signal. Thus, the preferred embodiment communication system will uniformly insert one reference symbol for every M coded data symbols.

The basic operation of RAKE receivers are described in an article by R. Price and P. E. Green, Jr., "A Communication Technique for Multipath Channels," *Proceedings of the IRE*, March 1958, pages 555-570. Briefly, a RAKE receiver performs a continuous, detailed measurement of the multipath characteristic of a received signal. This knowledge is then exploited to combat the selective fading by detecting the echo signals individually, using a correlation method, and algebraically combining those echo signals into a single detected signal. The intersymbol interference is attenuated by varying the time delay or phase between the various detected echo signals prior to their algebraic combination.

Figure 1:
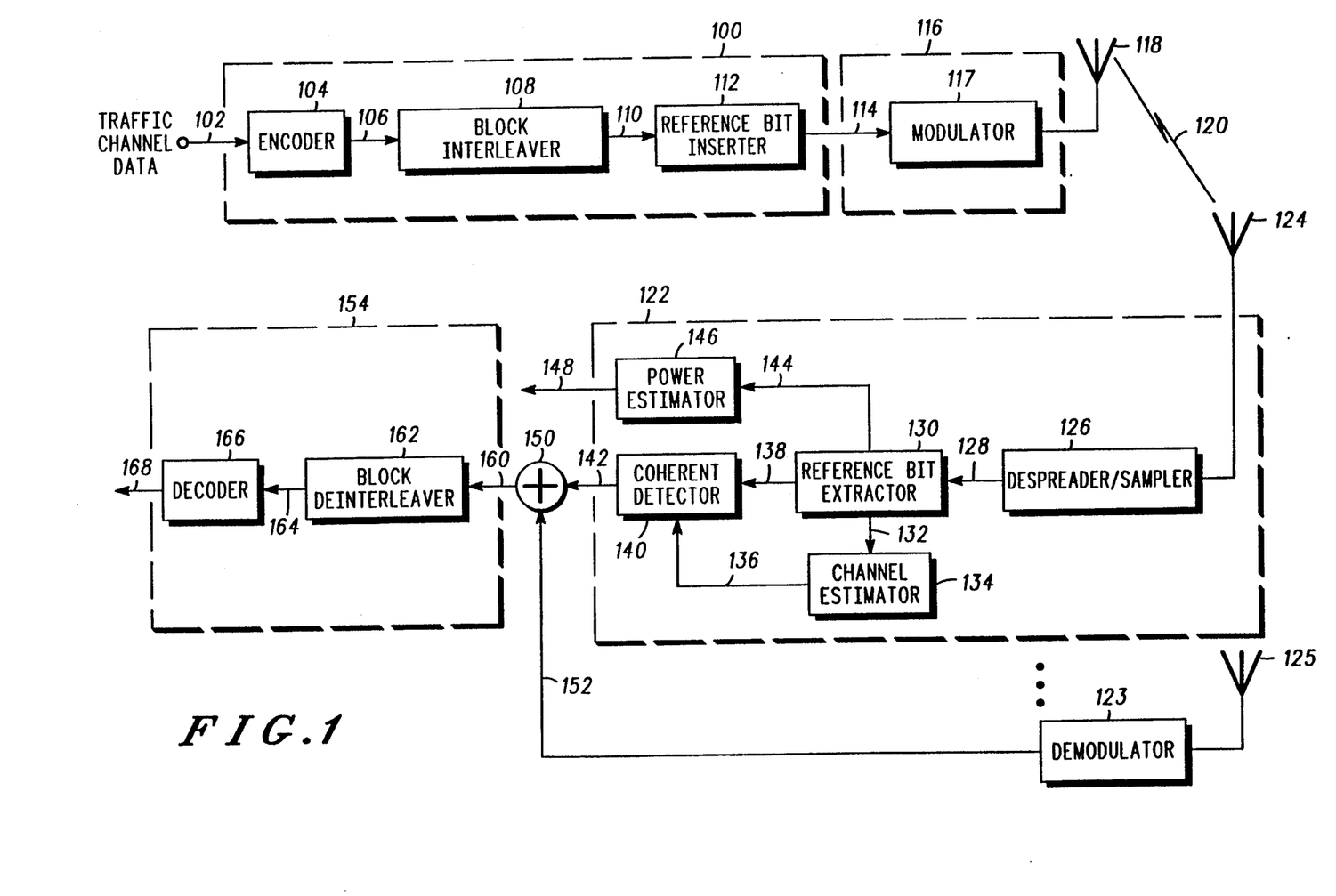
FIG. 1 is a block diagram showing a preferred embodiment communication system in accordance with the present invention.

Referring now to FIG. 1, a system for coherent communication in a spread-spectrum communication system is shown. In the encoding portion 100 of the communication system, traffic channel data bits 102 are input to an encoder 104 at a particular bit rate (e.g., 9.6 kilobit/second). The input traffic channel data bits can include either voice converted to data by a vocoder, pure data, or a combination of the two types of data. Encoder 104 encodes the input data bits 102 into data symbols at a fixed encoding rate (1/r) with an encoding algorithm which facilitates subsequent maximum likelihood decoding of the data symbols into data bits (e.g. convolutional or block coding algorithms). For example, encoder 104 encodes input data bits 102 (e.g., 192 input data bits that were received at a rate of 9.6 kilobits/second) at a fixed encoding rate of one data bit to three data symbols (i.e., ⅓) such that the encoder 102 outputs data symbols 106 (e.g., 576 data symbols output at a 28.8 kilosymbols/second rate).

The data symbols 106 are then input into an interleaver 108. Interleaver 108 organizes the data symbols 106 into blocks (i.e., frames) and block interleaves the input data symbols 106 at the symbol level. In the interleaver 108, the data symbols are individually input into a matrix which defines a predetermined size block of data symbols. The data symbols are input into locations within the matrix so that the matrix is filled in a column by column manner. The data symbols are individually output from locations within the matrix so that the matrix is emptied in a row by row manner. Typically, the matrix is a square matrix having a number of rows equal to the number of columns; however, other matrix forms can be chosen to increase the output interleaving distance between the consecutively input non-interleaved data symbols. The interleaved data symbols 110 are output by the interleaver 108 at the same data symbol rate that they were input (e.g., 28.8 kilosymbols/second). The predetermined size of the block of data symbols defined by the matrix is derived from the maximum number of data symbols which can be transmitted at a coded bit rate within a predetermined length transmission block. For example, if data symbols 106 are output from the encoder 104 at a 28.8 kilosymbols/second rate, and if the predetermined length of the transmission block is 20 milliseconds, then the predetermined size of the block of data symbols is 28.8 kilosymbols/second times 20 milliseconds which equals 576 data symbols which defines a 18 by 32 matrix.

Figure 2:
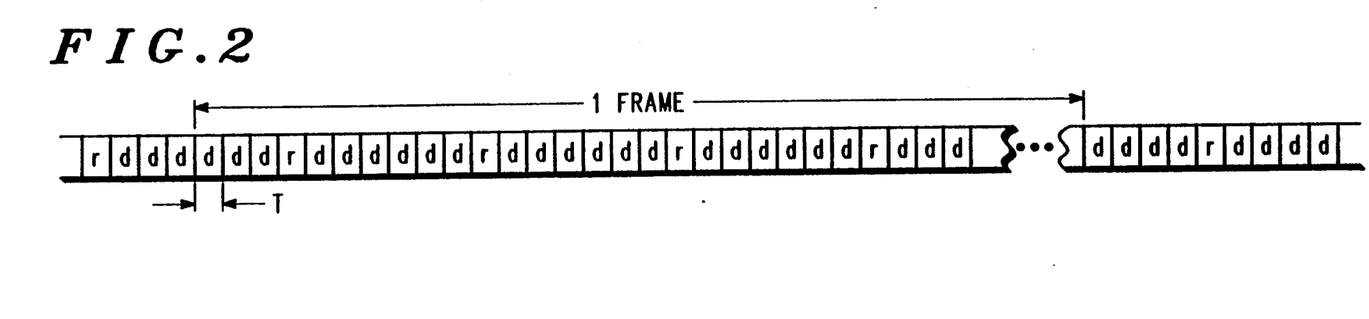
FIG. 2 is a block diagram showing a preferred embodiment communication channel frame structure for use in the preferred embodiment communication system shown in FIG. 1.

The interleaved data symbols 110 are then input to a reference bit inserter 112 which inserts L known reference bits for every M interleaved data symbols 110. To simplify the following discussion, it will be assumed that L=1 and M=6. In addition, it will be assumed that each inserted reference bit is a zero bit. However, it will be appreciated by those skilled in the art that L and M could be any other value without departing from the scope and spirit of the present invention. In addition, the reference bits could be any known sequence such as all one bits or several one bits followed by several zero bits without departing from the scope and spirit of the present invention. When L=1 and M=6, reference bit inserter 112 outputs 672 reference-coded bits 114 for each block (i.e., frame) such that a reference bit is inserted between each group of six data symbols. An example of a transmitted block (i.e., frame) of reference-coded data symbols 114 consisting of 42 bits is shown in FIG. 2 (where each d represents a data symbol and each r represents a reference bit).

The reference-coded data symbols 114 is output from encoding portion 100 of the communication system and input to a transmitting portion 116 of the communication system. The data symbols 114 are prepared for transmission over a communication channel by a modulator 117. Subsequently, the modulated signal is provided to an antenna 118 for transmission over the communication channel 120.

The modulator 117 preferably prepares the data symbols 114 for direct sequence code divided spread-spectrum transmission by deriving a sequence of fixed length codes from the reference-coded data symbols 114 in a spreading process. For example, each of the data symbols within the stream of reference-coded data symbols 114 may be spread to a unique nine bit length code such that a group of six data symbols is represented by a single 54 bit length code. In addition, each reference bit within the stream of reference-coded data symbols 114 may select a ten bit length code. The codes representing the group of six data symbols and an associated reference bit preferably are combined to form a single 64 bit length code. As a result of this spreading process, the modulator 117 which received the reference-coded data symbols 114 at a fixed rate (e.g., 28.8 kilosymbols/second) now has a spread sequence of 64 bit length codes having a higher fixed symbol rate (e.g., 307.2 kilosymbols/second). It will be appreciated by those skilled in the art that the reference bits and data symbols within the stream of reference-coded data symbols 114 may be spread according to numerous other algorithms into a sequence of larger length codes without departing from the scope and spirit of the present invention.

The spread sequence is further prepared for direct sequence code divided spread-spectrum transmission by further spreading the spread sequence with a long spreading code (e.g. PN code). The spreading code is a user specific sequence of symbols or unique user code which is output at a fixed chip rate (e.g., 1.228 Megachips/second). In addition to providing an identification as to which user sent the encoded traffic channel data bits 102 over the communication channel 120, the unique user code enhances the security of the communication in the communication channel by scrambling the encoded traffic channel data bits 102. In addition, the user code spread encoded data bits (i.e. data symbols) are used to bi-phase modulate a sinusoid by driving the phase controls of the sinusoid. The sinusoid output signal is bandpass filtered, translated to an RF frequency, amplified, filtered and radiated by an antenna 118 to complete transmission of the traffic channel data bits 102 in a communication channel 120 with BPSK modulation.

A receiving portion 122 of the communication system receives the transmitted spread-spectrum signal from over the communication channel 120 through antenna 124. The received signal is sampled into data samples by despreader and sampler 126. Subsequently, the data samples 142 are output to the decoding portion 154 of the communication system.

The despreader and sampler 126 preferably BPSK samples the received spread-spectrum signal by filtering, demodulating, translating from the RF frequencies, and sampling at a predetermined rate (e.g., 1.2288 Megasamples/second). Subsequently, the BPSK sampled signal is despread by correlating the received sampled signals with the long spreading code. The resulting despread sampled signal 128 is sampled at a predetermined rate and output to a reference bit extractor 130 (e.g., 307.2 kilosamples/second so that a sequence of four samples of the received spread-spectrum signal is despread and/or represented by a single data sample).

The reference bit extractor 130 preferably extracts the reference bits 132 from the despread sampled signal 128 and outputs the reference bits 132 to a channel estimator 134. The remaining data samples 138 from the despread sampled signal 128 are output to a coherent detector 140 for later coherent detection of data samples 142.

The channel estimator 134 correlates the extracted reference bits 132 with a known reference sequence of data samples to obtain unbiased, but noisy, channel estimates. In order to obtain a better channel estimate 136, these noisy estimates may be passed through a low-pass filter, which may be fixed or adaptive, to remove the high frequency noise components. The resulting channel estimates 136 are relatively noise-free and can be used for coherent detection. It should be noted that the low pass filtering only gives us a channel estimate for every $(M+1)T$, where M is the number of data symbols inserted between each reference bit inserted by reference bit inserter 112 (e.g., $M=6$) and where T is the time interval of each data sample. To perform coherent detection of transmitted data symbols, we need to have a channel estimate for every T. When $(M+1)T$ is short relative to the channel variation time constant, a simple but effective method to get a channel estimate for every T is to perform linear interpolation between two channel estimates separated by $(M+1)T$. However, as will be appreciated by those skilled in the art more sophisticated interpolation techniques may be used if necessary.

In the preferred embodiment coherent communication system, power control may also be used to enhance overall system performance. The power control algorithms may be very similar to the algorithms used in non-coherent communication systems. The preferred embodiment power control algorithm preferably includes estimating received power every 1.25 ms (i.e., each block or frame), or every 12 information bits, i.e., every 36 encoded bits or 42 total received signal samples. The power estimate may be calculated with several different techniques. One technique is to compute a channel estimate with a power estimator 146 by using simply the six reference signal samples (i.e., reference bits 144 from reference bit extractor 130) in a 42 bit length block. The square of the magnitude of the channel estimate is then output by the power estimator 146 as the power estimate 148.

After channel estimates 136 are generated, the rest of the receiver is conventional. The coherent detector 140 multiplies the remaining data samples 138 from the despread sampled signal 128 by the conjugate of the channel estimates 136 to generate coherently detected samples 142.

As will be appreciated by those skilled in the art, multiple receiving portions 122 through 123 and antennae 124 through 125, respectively, are used to achieve space diversity. The Nth receiver portion would operate in substantially the same manner to retrieve data samples from the received spread-spectrum signal in communication channel 120 as the above described receiving portion 122. The outputs 142 through 152 of the N receiving portions preferably are input to a summer 150 which diversity combines the input data samples into a composite stream of coherently detected data samples 160.

The individual data samples 160 which form soft decision data are then input into a decoding portion 154 including a deinterleaver 162 which deinterleaves the input soft decision data 160 at the individual data level.

In the deinterleaver 162, the soft decision data 160 are individually input into a matrix which defines a predetermined size block of soft decision data. The soft decision data are input into locations within the matrix so that the matrix is filled in a row by row manner. The deinterleaved soft decision data 164 are individually output from locations within the matrix so that the matrix is emptied in a column by column manner. The deinterleaved soft decision data 164 are output by the deinterleaver 162 at the same rate that they were input (e.g., 28.8 kilometrics/second).

The predetermined size of the block of soft decision data defined by the matrix is derived from the maximum rate of sampling data samples from the spread-spectrum signal received within the predetermined length transmission block.

The deinterleaved soft decision data 164, are input to a decoder 166 which uses maximum likelihood decoding techniques to generate estimated traffic channel data bits 168. The maximum likelihood decoding techniques may be augmented by using an algorithm which is substantially similar to a Viterbi decoding algorithm. The decoder 166 uses a group of the individual soft decision data 164 to form a set of soft decision transition metrics. These transition metrics are used at each particular time state of the maximum likelihood sequence estimation decoder 166. The number of soft decision data 164 in the group used to form each set of soft decision transition metrics corresponds to the number of data symbols 106 at the output of the convolutional encoder 104 generated from each input data bit 102. The number of soft decision transition metrics in each set is equal to two raised to the power of the number of soft decision data 164 in each group. For example, when a ⅓ convolutional encoder is used in the transmitter, three data symbols 106 are generated from each input data bit 102. Thus, the decoder 166 uses groups of three individual soft decision data 164 to form eight soft decision transition metrics for use at each time state in the maximum likelihood sequence estimation decoder 166. The estimated data bits 168 are generated at a rate related to the rate that the soft decision data 164 are input to the decoder 166 and the fixed rate used to originally encode the input data bits 102 (e.g., if the soft decision data are input at 28.8 kilometrics/second and the original encoding rate was ⅓ then estimated data bits 168 are output at a rate of 9600 bits/second).

Thus, a communication system for coherently encoding and decoding has been described above with reference to FIG. 1. In summary, the communication system includes a first portion which encodes input data bits into data symbols, interleaves the data symbols in a symbol by symbol manner, inserts reference bits into the interleaved symbols, modulates and transmits the reference-coded data symbols over a communication channel. The communication system further includes a second portion which receives and demodulates a signal from over the communication channel, estimates parameters of the communication channel, coherently demodulates data samples within received signal, deinterleaves the coherently detected data samples which are used as soft decision data within each received transmission block, subsequently generates soft decision transition metrics from the deinterleaved individual soft decision data, and subsequently generates estimated data bits from the soft decision metrics by using maximum likelihood decoding techniques.

To more clearly describe the reasoning behind this method of using reference bits to coherently detect data samples and the operation of the channel estimator 134 as well as to facilitate further discussion, let us establish the following mathematical model.

It will be appreciated by those skilled in the art that a fading channel can be modeled as a complex valued function of time t, denoted by h(t). The time interval of the convolutionally encoded-reference bits is denoted by T. The received signal after demodulation and despreading is then sampled at every T. Assuming that one reference bit is inserted for every 6 encoded bits, the samples corresponding to the reference bit appears at $nT_r = 7nT$, $n = \ldots, -1, 0, 1, \ldots$, where $T_r = 7T$ is defined. Then, the noisy estimates may be written as:

$$\tilde{h}(nT_r) = h(nT_r) + z(nT_r) \quad \text{(eq. 1)}$$

where $z(nT_r)$ is the sampled additive noise. A better estimate than that shown in (eq. 1) can be obtained such that:

$$\hat{h}(nT_r) = \frac{1}{2N+1} \sum_{k=-N}^{N} \tilde{h}(nT_r + kT_r). \quad \text{(eq. 2)}$$

For example N=3 may be chosen. By doing so, an estimate is obtained for every reference bit interval $T_r$ using 7 of the noisy estimates. To obtain the channel estimate at kT for $k \neq 7n$ which are needed for generating coherent detection information, interpolation techniques can be used. The easiest interpolation method is to use linear interpolation. For example, assuming that $k = 7n + i$ where $1 \leq i \leq 6$, results in (eq. 2) being rewritten as:

$$\begin{aligned} \hat{h}(kT) &= \frac{1}{7}[(7-i) \times \hat{h}(7nT) + i \times \hat{h}(7nT + 7T)] \\ &= \frac{1}{7}\{(7-i) \times \hat{h}(nT_r) + i \times \hat{h}[(n+1)T_r]\}. \end{aligned} \quad \text{(eq. 3)}$$

Other more sophisticated interpolation techniques can be used to further improve the estimation. However, when the channel fading is slow relative to the sampling rate $1/T_r$ of the reference signal, the linear interpolation method described above is sufficient.

It will be appreciated by those skilled in the art that the sampled channel response $h(n) \equiv h(nT_r)$ can be modeled as a slowly time-varying random process with a power spectrum $\Phi(f)$, and $\Phi(f) = 0$ for $f < -f_d$ and $f > f_d$ where $f_d$ is the Doppler frequency. If $f_d$ is not known or may change with time, the best estimate h(n) which can obtained is to pass the noisy estimate $\tilde{h}(kT_r)$ through an ideal low-pass linear-phase filter which rejects the noise components with frequency $|f| > f_{d,max}$. The optimal filter would have a frequency response, i.e. the Fourier transform of $w_k$ denoted as:

$$f(\omega) \begin{cases} 1 & -f_{d,max} \leq f \leq f_{d,max} \\ 0 & \text{elsewhere.} \end{cases} \quad \text{(eq. 4)}$$

Figure 3:
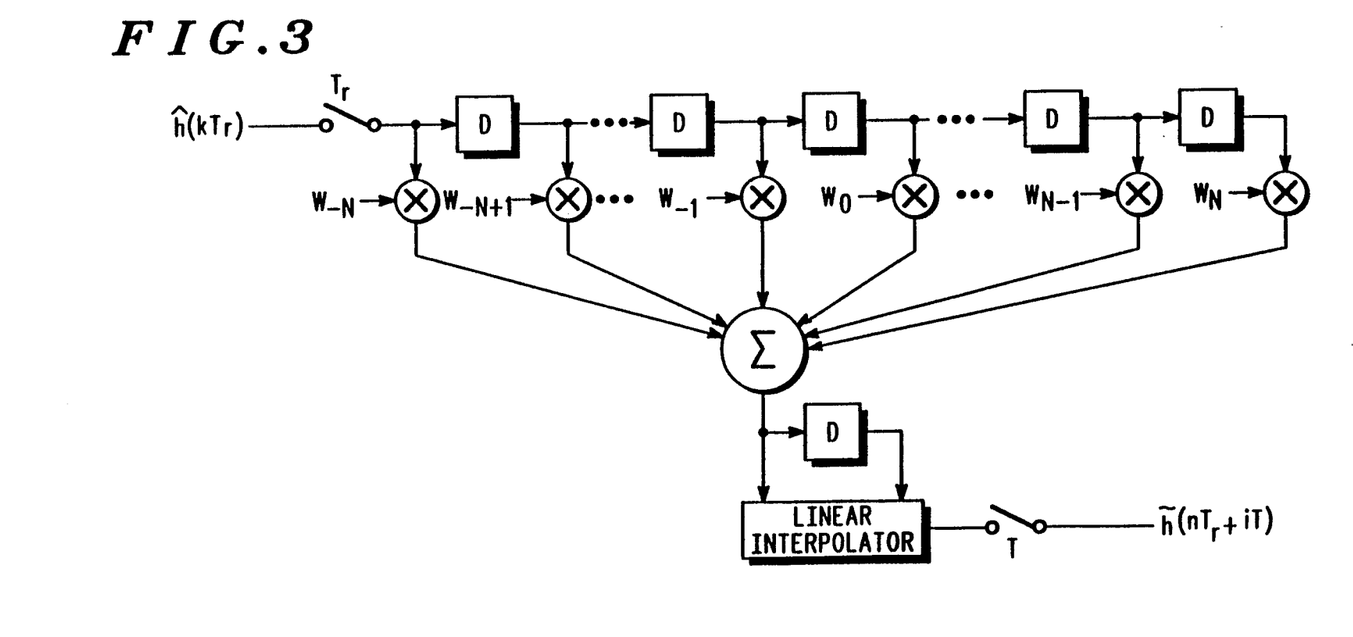
FIG. 3 is a block diagram showing a preferred embodiment channel estimator for use in the preferred embodiment communication system shown in FIG. 1.

One such filter is finite impulse response (FIR) filter which has an output which can be written as:

$$h(n) = h(nT_r) = \sum_{k=-N}^{N} w_k h(nT_r + kT_r) \quad \text{(eq. 5)}$$

where $w_k$ is the FIR filter coefficients, or weights, for generating the estimate. It is easy to see that the (2N+1) sample average method described above is a specialty case of this weighted sum method, if $w_k = 1/(2N+1)$. By selecting $w_k$ according to the criterion described above, a better estimate of h(n) can be obtained, although delay will be introduced. FIG. 3 illustrates how (eq. 5) may be implemented to generate a channel estimate using a weighted average of noise channel estimated based on the reference signal.

It will be appreciated by those skilled in the art that the performance of an ideal coherent receiver over a Rayleigh fading channel is well known. Therefore, the following discussion will analyze the performance loss of the reference-based channel estimation method relative to the optimal coherent receiver over such a channel.

The loss is mainly caused by two factors. First, because of the insertion of non-information bearing reference bits, the energy per information bit ($E_b$) is effectively reduced (i.e., the data rate is reduced), when the total transmitted power remains the same. Second, in the presence of noise, there are errors in the channel estimates. The total loss is the combined result of these two factors.

The loss in $E_b$ due to reference insertion, denoted by $\xi_i$, can be simply expressed as:

$$\xi_i = (M+1)/M = 1 + 1/M \quad \text{(eq. 6)}$$

where 1/M is the insertion rate. For example, for M=6, a loss in $E_b$ of $10\log_{10}(7/6) \approx 0.67$ dB occurs.

In order to analyze the performance loss due to estimation error, a channel and signaling model must first be established for the DS-CDMA up-link. A DS-CDMA up-link can be viewed as multiple flat fading channels. For each of the flat fading channels, the received signal after despreading can be expressed as:

$$r(k) = h(k)a(k) + z(k) \quad \text{(eq. 7)}$$

where r(k) is the received sample at kT, a(k) is the corresponding transmitted data or reference symbol, h(k) is a low-pass random complex variable characterizing the fading channel, and z(k) is the additive noise or interference, which is approximately white and Gaussian. The average signal to noise ratio is equal to $E[|a(k)|^2]E[|h(k)|^2]/\sigma_z^2$, where $\sigma_z^2$ is the noise variance. According to Jakes' channel model (as described in W. C. Jakes, Ed., *Microwave Mobile Communications*, John Wiley, New York, 1974), h(k) is unbiased and Gaussian distributed. Its power spectrum, called Doppler spectrum, is given by:

$$H(f) = \frac{3}{2\pi f_d}\left[1 - \left(\frac{f}{f_d}\right)^2\right]^{-\frac{1}{2}} \quad \text{(eq. 8)}$$

where $f_d$ is the Doppler frequency, which is a function of the carrier frequency and the mobile communication unit speed. It can be further assumed that BPSK signaling is used. It will be appreciated by those skilled in the art that the following assumptions also are applicable to quadrature phase shift keying signaling. Given that |a(k)| = 1, then it may be assumed that the reference symbols are inserted at (M+1)kT, so that a((M+1)k) and r((M+1)k) are the reference symbols and the corresponding received samples, respectively. By multiplying r((M+1)k) with the conjugate of the reference symbol a*((M+1)k), the resulting channel estimate is:

$$h((M+1)k) = h((M+1)k) + a^*((M+1)k)z((M+1)k). \quad \text{(eq. 9)}$$

In the channel estimate given by (eq. 9), h((M+1)k), is a low-pass random variable and the second term is the channel estimation error. When $1/(M+1)T > 2f_d$, the channel estimate at (M+1)kT can be further improved, i.e., the variance of the channel estimation error can be reduced. It is known from Wiener filtering theory that the optimal unbiased channel estimate, in the sense of maximizing the ratio of signal energy to the variance of estimation error, can be obtained by passing h((M+1)k) through a linear-phase filter whose magnitude response is equal to the square-root of the quotient of H(f) divided by the noise spectrum. The optimal channel estimator based on the inserted reference symbols is indeed a linear phase matched filter, which is matched to the channel Doppler spectrum divided by the noise spectrum.

Practically, it is difficult to implement such an optimal estimator, because the Doppler and noise spectra are usually not known and will change with time. A sub-optimum and realistic solution is to use a fixed, linear-phase, low-pass filter, whose cut-off frequency is greater than or equal to the maximum possible Doppler frequency.

By filtering h((M+1)k) using an ideal low-pass linear phase filter, whose cut-off frequency is $f_{cut-off}$, with zero group delay, or equivalently a fixed group delay, and unit magnitude in its passband, the output at the filter can be expressed as:

$$h((M+1)k) = h((M+1)k) + z((M+1)k) \quad \text{(eq. 10)}.$$

It can be shown that the variance of z((M+1)k), the residual estimation error, is equal to $\sigma_z^2 \times (2f_{cut-off}/f_r)$, where $f_r = 1/(M+1)T$ is the reference symbol insertion frequency. More precisely, after filtering, the variance of the channel estimation error is reduced by a factor of $2f_{cut-off}/f_r$. Subsequently, by using linear interpolation, the channel estimates at kT, for $k \neq (M+1)k$ can be generated according to (eq. 3). From (eq. 7) and (eq. 10) the coherently detected samples can be written as:

$$\begin{aligned} a(n) &= r(k)h^*(k) \\ &= |h(k)|^2 a(k) + z^*(k)h(k)a(k) + \\ &\quad z(k)h^*(k) + z(k)z^*(k) \end{aligned} \quad \text{(eq. 11)}$$

If it is further assumed that z(k)h(k)a(k) and z(k)h*(k) are independent and the high order error term z(k)z*(k) is negligible, then the total noise variance at the output of the detector is equal to $|h(k)|^2 (\sigma_z^2 + \sigma_z^2)$. By comparing this result with the optimum coherent receiver for max-ratio combining, which has a noise variance of $|h(k)|^2 \sigma_z^2$ at the detector output, it may be concluded that the loss due to estimation error is approximately equal to:

$$\xi_{est} \approx 1 + \sigma_z^2/\sigma_z^2 = 1 + (2f_{cut-off}/f_r) \quad \text{(eq. 12)}.$$

By combining (eq. 6) and (eq. 12), the total performance loss may be expressed as:

$$\xi_{total} \approx [1+(2f_{cut-off}/f_r)] \times (1+1/M) \qquad \text{(eq. 13)}.$$

The system performance may be optimized by selecting a proper M to minimize $\xi_{total}$.

For an $r=\frac{1}{3}$ convolutionally coded system with information bit rate of 9600 bits per second, the coded bit rate is equal to 28,800 bits per second. Letting $M=6$, then $f_r=4800$ Hertz (Hz). For an $f_{cut-off}=300$ Hz, the total loss is $(1+\frac{1}{8})\times(1+1/6)=63/48$ or about 1.14 dB. Since an optimal coherent receiver requires an $E_b/N_0$ over 3 dB less than that required by a non-coherent receiver, a gain of over 2 dB can be expected.

When diversity combining of signals from multiple RAKE fingers and/or multiple antennas is used, the difference in performance between the coherent receiver and non-coherent receiver could be even larger because the combining loss in a non-coherent receiver does not exist for a coherent receiver. Although this additional advantage may be partially cancelled out due to the fact that, when diversity combining is used, the communication system is likely to be operated at lower signal-to-noise ratios for the individual signals to be combined than without diversity. As a result, the second order term in (eq. 11) can not be ignored.

In the above analysis, it has been assumed that an ideal low-pass filter is used for channel estimation. Realization of such an ideal filter will require an infinite delay. A practical filter must have a transition band to have a finite delay. Thus, the allowable maximum Doppler frequency should be less than the effective bandwidth of the filter. For example, a filter may be designed which has a transition band from 200 Hertz to 400 Hertz. The resulting filter will have a delay less than five milliseconds while keeping the effective bandwidth equal to 300 Hertz. By using such a filter, there is no additional loss if the mobile communication unit speed is less than 220 kilometers per hour.

Furthermore in the above analysis, it was assumed that the data and reference symbols are transmitted continuously. As a result, the reference signals are available every $T_r$ time interval and these reference signals can be used for channel estimation by means of low-pass filtering. In some cases, such as when variable rate speech transmission is used, it is desirable to transmit data in short and discontinuous blocks. In such a case, the referenced symbols are also transmitted discontinuously and the low pass filtering method described above should be modified to be applicable as described below.

First, it will be appreciated by those skilled in the art that when the duration of a data block is short relative to the time constant of channel variation, the channel response may be assumed to vary linearly during the time span of a block. Thus, the channel response $h(kT)$ may be expressed as:

$$h(kT) = \alpha + \beta k \qquad \text{(eq. 14)}$$

where $\alpha$ and $\beta$ are two complex constants to be estimated. These two constants may be determined by using the received reference samples through linear best-fitting based on the least squares (LS) principle. The details of such estimation methods are illustrated by the following example.

If a transmitted data block (i.e., frame) is assumed to consist of 36 data symbols as well as 6 inserted reference symbols (see FIG. 2), then 42 symbols are transmitted per data block. This data block may be separated by time intervals in which no data is transmitted. Thus, when such a short block is received, we only have 6 reference samples during the time interval of interest.

In this example, the channel estimation is performed by using only the received reference samples. The received samples may be denoted by $r(k)$, $k=0, \ldots, 41$, which can be written as:

$$r(k) = h(kT)a(k) + z(k) \qquad \text{(eq. 15)}$$

where $a(k)$ is the kth transmitted symbol, which can be either a data symbol (not known to the receiver) or a reference symbol (known to the receiver), and $z(k)$ is the additive noise at k. In this example, for a reference sample $r(k)$, $k=7i+3$, $i=0, 1, 2, 3, 4$, and 5, since $a(k)$ is known, a noisy channel estimate can be obtained as:

$$h(kT) = r(k)a^*(k) \qquad \text{(eq. 16)}$$

where $a^*(k)$ represents the complex conjugate of $a(k)$. By minimizing the LS error between $h(kT)$ given by (eq. 14) and $h(kT)$, the LS estimates of $\alpha$ and $\beta$ may satisfy the following:

$$\alpha N + \beta \sum_k k = \sum_k h(k) \qquad \text{(eq. 17)}$$

$$\alpha \sum_k k + \beta \sum_k k^2 = \sum_k kh(k) \qquad \text{(eq. 18)}$$

where N is the number of elements in the summation and $h(kT)$ is given by (eq. 16) and the summation index k takes the value $k=3+7i$, $i=0, 1, \ldots, 5$. The solution of $\alpha$ and $\beta$ is given by:

$$\alpha = d\left[\sum_k k^2 \times \sum_k h(k) - N\sum_k kh(k)\right] \qquad \text{(eq. 19)}$$

$$\beta = d\left[N\sum_k h(k) - \sum_k k \times \sum_k h(k)\right] \qquad \text{(eq. 20)}$$

where $$d = 1/\left[N\sum_k k^2 - \left(\sum_k k\right)^2\right] \qquad \text{(eq. 21)}$$

Thus, the estimates channel responses at time kT, $k=0, 1, \ldots, 41$ can be computed according to (eq. 14) using the estimated $\alpha$ and $\beta$.

Although the invention has been described and illustrated with a certain degree of particularity, it is understood that the present disclosure of embodiments has been made by way of example only and that numerous changes in the arrangement and combination of parts as well as steps may be resorted to by those skilled in the art without departing from the spirit and scope of the invention as claimed. For example, the modulator, antennas and demodulator portions of the preferred embodiment communication system as described were directed to CDMA spread-spectrum signals transmitted over a radio communication channel. However, as will be understood by those skilled in the art, the encoding and decoding techniques described and claimed herein can also be adapted for use in other types of transmission systems like those based on time division multiple access (TDMA) and frequency division multiple access (FDMA). In addition the communication channel could alternatively be an electronic data bus, wireline, optical fiber link, satellite link, or any other type of communication channel.

What is claimed is:

1. A communication unit comprising:
   (a) reference means for inserting reference symbols into a stream of input data symbols to form a reference coded stream of input data symbols; and
   (b) spreading means, operatively coupled to the reference means, for preparing the reference coded stream of input data symbols for transmission over a communication channel by spreading the reference coded stream of input data symbols with a spreading code prior to transmission over the communication channel.

2. The communication unit of claim 1 wherein the reference means inserts reference symbols into a stream of input data symbols according to an insertion algorithm to form a reference coded stream of input data symbols, the insertion algorithm comprising inserting reference symbols at a rate greater than twice of channel variation frequency of a communication channel over which the reference coded stream of input data symbols is to be transmitted.

3. The communication unit of claim 1 wherein the spreading means comprises first spreading means for spreading the reference symbols with a first spreading code and second spreading means for spreading the stream of input data symbols with a second spreading code.

4. The communication unit of claim 3 wherein the first spreading code is substantially similar to the second spreading code.

5. The communication unit of claim 3 wherein the first spreading code is substantially different from the second spreading code.

6. The communication unit of claim 1 wherein the spreading means comprises first spreading means for spreading the reference symbols at a first rate of spreading and second spreading means for spreading the stream of input data symbols at a second rate of spreading.

7. The communication unit of claim 6 wherein the first rate of spreading is substantially similar to the second rate of spreading.

8. The communication unit of claim 6 wherein the first rate of spreading is substantially different from the second rate of spreading.

9. The communication unit of claim 1 further comprising a transmitting means, operatively coupled to the spreading means, for transmitting the spread reference coded stream of input data symbols over the communication channel.

10. The communication unit of claim 9 wherein the communication channel is selected from the group consisting of an electronic data bus, radio communication link, wireline, optical fiber link, and satellite link.

11. A communication unit comprising:
    (a) demodulating means for despreading a received communication signal with a spreading code to derive a stream of reference samples and a stream of data samples;
    (b) channel estimation means, operatively coupled to the extracting means, for estimating the channel response by utilizing the stream of reference samples; and
    (c) detection means, operatively coupled to the extracting means and the channel estimation means, for generating an estimated data symbol from the stream of data samples by utilizing the estimated channel response.

12. The communication unit of claim 11 wherein the demodulating means comprises first despreading means for despreading the received communication signal with a first despreading code to derive the stream of reference samples and second despreading means for despreading the received communication signal with a second despreading code to derive the stream of data samples.

13. The communication unit of claim 12 wherein the first despreading code is substantially similar to the second despreading code.

14. The communication unit of claim 12 wherein the first despreading code is substantially different from the second despreading code.

15. The communication unit of claim 11 wherein the demodulating means comprises first despreading means for despreading the received communication signal at a first rate of despreading to derive the stream of reference samples and second despreading means for despreading the received communication signal at a second rate of despreading to derive the stream of data samples.

16. The communication unit of claim 15 wherein the first rate of despreading is substantially similar to the second rate of despreading.

17. The communication unit of claim 15 wherein the first rate of despreading is substantially different from the second rate of despreading.

18. The communication unit of claim 11 wherein the channel estimation means comprises means for estimating the channel response by low-pass filtering the stream of reference samples.

19. The communication unit of claim 11 wherein the channel estimation means comprises means for estimating the channel response as a linear function of sampling time.

20. The communication unit of claim 11 wherein the channel estimation means comprises:
    (a) filtering means for generating an estimate of the channel response associated with each reference sample by low-pass filtering the stream of reference samples; and
    (b) interpolating means, operatively coupled to the filtering means, for generating an estimated channel response between at least two of the reference sample estimated channel responses.

21. The communication unit of claim 11 wherein the detection means comprises means for generating the estimated data symbol from the stream of data samples by correlating the estimated channel response with the stream of data samples.

22. The communication unit of claim 11 wherein the detection means comprises means for generating an estimated data bit by utilizing maximum likelihood decoding techniques to derive the estimated data bit from the estimated data symbol.

23. The communication unit of claim 11 wherein the detection means comprises means for generating an estimated data bit by utilizing a Viterbi maximum likelihood decoding algorithm to derive the estimated data bit from the estimated data symbol.

24. The communication unit of claim 11 further comprising a receiving means, operatively coupled to the demodulating means, for receiving the communication signal over a communication channel.

25. The communication unit of claim 24 wherein the communication channel is selected from the group consisting of an electronic data bus, radio communication link, wireline, optical fiber link, and a satellite link.

26. A communication system comprising:
 (a) a transmitter, comprising:
  (i) reference means for inserting reference symbols into a stream of input data symbols to form a reference coded stream of input data symbols;
  (ii) spreading means, operatively coupled to the reference means, for preparing the reference coded stream of input data symbols for transmission over a communication channel by spreading the reference coded stream of input data symbols with a spreading code prior to transmission over the communication channel; and
  (iii) a transmitting means, operatively coupled to the spreading means, for transmitting the spread reference coded stream of input data symbols over the communication channel; and
 (b) a receiver, comprising:
  (i) receiving means for receiving the communication signal over the communication channel;
  (ii) demodulating means, operatively coupled to the receiving means, for despreading the received communication signal with a spreading code to derive a stream of reference samples and a stream of data samples;
  (iii) channel estimation means, operatively coupled to the extracting means, for estimating the channel response by utilizing the stream of reference samples; and
  (iv) detection means, operatively coupled to the extracting means and the channel estimation means, for generating an estimated data symbol from the stream of data samples by utilizing the estimated channel response.

27. The communication system of claim 26 wherein the transmitter reference means inserts reference symbols into a stream of input data symbols according to an insertion algorithm to form a reference coded stream of input data symbols, the insertion algorithm comprising inserting reference symbols at a rate greater than twice of channel variation frequency of a communication channel over which the reference coded stream of input data symbols is to be transmitted.

28. The communication unit of claim 26 wherein:
 (a) the transmitter spreading means comprises first spreading means for spreading the reference symbols with a first spreading code and second spreading means for spreading the stream of input data symbols with a second spreading code; and
 (b) the receiver demodulating means comprises first despreading means for despreading the received communication signal with the first despreading code to derive the stream of reference samples and second despreading means for despreading the received communication signal with the second despreading code to derive the stream of data samples.

29. The communication system of claim 26 wherein:
 (a) the transmitter spreading means comprises first spreading means for spreading the reference symbols at a first rate of spreading and second spreading means for spreading the stream of input data symbols at a second rate of spreading; and
 (b) the receiver demodulating means comprises first despreading means for despreading the received communication signal at the first rate of despreading to derive the stream of reference samples and second despreading means for despreading the received communication signal at the second rate of despreading to derive the stream of data samples.

30. The communication system of claim 26 wherein the receiver channel estimation means comprises means for estimating the channel response by low-pass filtering the stream of reference samples.

31. The communication system of claim 26 wherein the receiver channel estimation means comprises means for estimating the channel response as a linear function of sampling time.

32. The communication system of claim 26 wherein the receiver channel estimation means comprises:
 (i) filtering means for generating an estimate of the channel response associated with each reference sample by low-pass filtering the stream of reference samples; and
 (ii) interpolating means, operatively coupled to the filtering means, for generating an estimated channel response between at least two of the reference sample estimated channel responses.

33. The communication system of claim 26 wherein the receiver detection means comprises means for generating the estimated data symbol from the stream of data samples by correlating the estimated channel response with the stream of data samples.

34. The communication system of claim 26 wherein the receiver detection means comprises means for generating an estimated data bit by utilizing maximum likelihood decoding techniques to derive the estimated data bit from the estimated data symbol.

35. The communication system of claim 26 wherein the communication channel is selected from the group consisting of an electronic data bus, radio communication link, wireline, optical fiber link, and satellite link.

36. A method of communication comprising:
 (a) inserting reference symbols into a stream of input data symbols to form a reference coded stream of input data symbols; and
 (b) preparing the reference coded stream of input data symbols for transmission over a communication channel by spreading the reference coded stream of input data symbols with a spreading code prior to transmission over the communication channel.

37. The method of claim 36 wherein the step of inserting comprises inserting reference symbols into a stream of input data symbols according to an insertion algorithm to form a reference coded stream of input data symbols, the insertion algorithm comprising inserting reference symbols at a rate greater than twice of channel variation frequency of a communication channel over which the reference coded stream of input data symbols is to be transmitted.

38. The method of claim 36 further comprising the step of transmitting the spread reference coded stream of input data symbols over the communication channel.

39. A method of communication comprising:
 (a) despreading a received communication signal with a spreading code to derive a stream of reference samples and a stream of data samples;
 (b) estimating the channel response by utilizing the stream of reference samples; and (c) generating an estimated data symbol from the stream of data samples by utilizing the estimated channel response.

40. The method of claim 39 wherein the estimating step comprises:

(a) generating an estimate of the channel response associated with each reference sample by low-pass filtering the stream of reference samples: and (b) generating an estimated channel response between at least two of the reference sample estimated channel responses.

41. The method of claim 39 wherein the generating step comprises generating the estimated data symbol from the stream of data samples by correlating the estimated channel response with the stream of data samples.

42. The method of claim 39 further comprising the step of receiving the communication signal over a communication channel.

* * * * *